(12) United States Patent
Shirley

(10) Patent No.: US 6,548,110 B1
(45) Date of Patent: *Apr. 15, 2003

(54) PROCESS LIQUID DISPENSE METHOD AND APPARATUS

(75) Inventor: Paul Shirley, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/715,491

(22) Filed: Nov. 17, 2000

Related U.S. Application Data

(63) Continuation of application No. 09/203,794, filed on Dec. 1, 1998, now Pat. No. 6,171,401, which is a continuation of application No. 08/909,572, filed on Aug. 12, 1997, now Pat. No. 5,912,049.

(51) Int. Cl.[7] .................................................. B05D 3/12
(52) U.S. Cl. ........................ 427/240; 427/425; 118/52; 118/320; 438/758
(58) Field of Search ................................. 427/240, 425, 427/385.5; 118/52, 320; 437/231; 438/761, 758

(56) References Cited

U.S. PATENT DOCUMENTS

| 4,267,212 A | 5/1981 | Sakawaki |
| 4,741,926 A | 5/1988 | White et al. |
| 4,748,053 A | 5/1988 | Okada |
| 4,850,299 A | 7/1989 | Merullo et al. |
| 5,066,616 A | 11/1991 | Gordon |
| 5,070,813 A | * 12/1991 | Sakai et al. ................. 118/695 |
| 5,358,740 A | 10/1994 | Bornside et al. |
| 5,395,803 A | 3/1995 | Adams |
| 5,405,813 A | 4/1995 | Rodrigues |
| 5,453,406 A | 9/1995 | Chen |
| 5,567,660 A | 10/1996 | Chen et al. |
| 5,677,001 A | 10/1997 | Wang et al. |
| 5,773,083 A | 6/1998 | Fischer et al. |
| 5,780,105 A | 7/1998 | Wang |
| 5,837,319 A | 11/1998 | Walters et al. |
| 5,985,363 A | 11/1999 | Shiau et al. |
| 5,989,632 A | * 11/1999 | Sanada et al. ............... 427/240 |
| 6,033,728 A | 3/2000 | Kikuchi et al. |
| 6,171,401 B1 | 1/2001 | Shirley |

* cited by examiner

Primary Examiner—Shrive P. Beck
Assistant Examiner—Kirsten Crockford Jolley
(74) Attorney, Agent, or Firm—Kirkpatrick & Lockhart LLP

(57) ABSTRACT

Methods of dispensing process liquid to provide a uniform layer of the liquid on a surface are disclosed in accordance with the present invention. The methods include dispensing a process liquid on the surface and rotating the surface at a first speed to distribute an effective amount of the process liquid to substantially wet the surface. The method further includes rotating the surface at a second speed to distribute an effective amount of the process liquid to produce a layer of the process liquid on the surface. In a preferred embodiment for dispensing photoresist onto the surface of a semiconductor wafer, the method includes rotating the wafer at the first speed prior to dispensing the photoresist onto the surface. The preferred method further includes decelerating the wafer from the first to the second speed during the dispensing of the photoresist and terminating the dispensing process after the second speed is reached.

22 Claims, 2 Drawing Sheets

PROCESS LIQUID DISPENSE METHOD AND APPARATUS

CROSS-REFERENCE TO RELATED APPLICATIONS

This application is a continuation of application Ser. No. 09/203,794, filed Dec. 1, 1998, which is a continuation of application Ser. No. 08/909,572, filed Aug. 12, 1997, now U.S. Pat. No. 5,912,049.

STATEMENT REGARDING FEDERALLY SPONSORED RESEARCH OR DEVELOPMENT

Not Applicable

BACKGROUND OF THE INVENTION

The present invention generally relates to dispensing liquids onto a surface. More particularly, the present invention relates to methods of spin dispensing process liquids, such as photoresist, onto a surface of a semiconductor wafer that more evenly distribute the process liquids over the surface and reduce the number of defects resulting from maldistribution of the liquid on the surface.

Integrated circuits are solid state devices in which electrical components and electrical connections between the components are incorporated into a solid matrix. The circuits are formed by the strategic placement of various conducting, semiconducting and insulating materials on a substrate. The development of the integrated circuit has led to the miniaturization of electronics by providing a strong matrix to support and protect fragile miniaturized components and connections and by facilitating the placement of the electrical components in close proximity. The integrated circuit has further served to increase the reliability of electronic devices by the elimination of moving parts and fragile electrical wiring and connections.

Integrated circuits are typically constructed by depositing a series of individual layers of predetermined materials on a wafer shaped semiconductor substrate, or "wafer". The individual layers of the integrated circuit are in turn produced by a series of manufacturing steps. For example, silicon dioxide is typically deposited over a previously formed circuit layer to provide an insulating layer for the circuit. Subsequent circuit layers are formed on the wafer using a radiation alterable material, known as photoresist.

Photoresist materials are generally composed of a mixture of organic resins, sensitizers and solvents. Sensitizers are compounds, such as diazonaphthaquinones, that undergo a chemical change upon exposure to radiant energy, such as visible and ultraviolet light. The irradiated sensitizer generally has different physical properties than the non-irradiated sensitizer, such as differing solvation characteristics. Resins are used to provide mechanical strength to the photoresist. Solvents are added to lower the viscosity of the photoresist, which facilitates a more uniform application of the liquid over the surface of the wafers.

A smooth, level layer of photoresist is formed on the wafer to provide a proper surface for depositing additional layers in the production of the circuit. After the photoresist layer is formed, it is typically heated to evaporate the solvents and harden the layer.

The hardened photoresist layer is then selectively irradiated to produce a layer having varying salvation characteristics. A radiation mask having transparent and opaque portions that define the next circuit layer pattern is used in conjunction with a radiation source to selectively expose the layer to radiation.

Following irradiation, the photoresist layer is exposed to a chemical, known as developer, in which either the irradiated or the nonirradiated photoresist is soluble. The soluble portion of the photoresist is dissolved exposing portions of the underlying insulating layer in the pattern defined by the mask. Developer solutions need to be uniformly distributed over the substrate surface to facilitate uniform dissolution of the photoresist layer.

Photoresist and developer solutions and other process liquids are typically applied to the wafer while the wafer is being spun on a rotating chuck, using a technique known as a spin dispensing, or coating. The liquid may be dispensed before the wafer is spun (i.e., statically) or while the wafer is spinning (i.e., dynamically). The spinning of the wafer distributes the liquid over the surface of the material.

The final thickness and uniformity of a process liquid layer depends on a number of variables. Spin variable, such as spinning speed, time and acceleration, dispense techniques, times and quantities can greatly affect the layer. The system pressure, temperature, and exhaust flow rate, as well as the physical properties of the process liquid, such as the viscosity and the vapor pressure of the volatile components, also affect the thickness and uniformity. If the spin variables are not matched to the process liquid, the resulting layer may contain an unacceptable number of defects. Commonly, a string of defects occurs starting near the center of the surface and extending radially perpendicular to the edge of the surface. The strings of defects, called striations, are thought to be air bubbles trapped in the liquid during the coating process.

Generally, efforts to provide a more uniform layer of process liquid during spin dispensing have focused on either changing the dispense nozzle design to provide a different dispense pattern and varying the spin pattern of the substrate to alter the distribution pattern of the liquid after it has been dispensed onto the surface of the substrate. Examples of the different nozzles used to dispense process liquid can be found in U.S. Pat. No. 5,002,008 issued to Ushijima et al., U.S. Pat. No. 5,020,200 issued to Mimasaka et al. and U.S. Pat. No. 5,429,912 issued to Neoh to name a few.

A number of spin techniques have been developed attempting to uniformly distribute the process liquid over the surface of the substrate. For example, U.S. Pat. No. 4,741, 926 issued to White discloses spin coating an organic material at a speed of not less than 4000 rpm, preferably 6000–8000 rpm, until a build up of coating is detectable on a side wall of a topographical feature on the surface. The rotational speed is then decelerated to less than 4000 rpm, preferably 1000–3500 rpm to produce a layer of desired thickness. A difficulty with the White process is that a sensor must be positioned to detect the build up of coating material on the side wall. Because the location of the build up will most likely vary from wafer to wafer, it may be difficult to reliably or consistently detect. Also, an excess amount of coating material may be necessary to compensate for material spun off the wafer before the build up of coating material is detected on the side wall.

In U.S. Pat. No. 5,405,813 issued to Rodrigues, methods are disclosed involving four different spinning steps for optimizing the distribution of photoresist on a semiconductor wafer. The methods provide for spinning the wafer at a first rotational speed and then decelerating the wafer. Photoresist is applied during the deceleration until a second rotational speed is reached and the dispensing of the photoresist is stopped. The wafer is then accelerated to a third rotational speed to produce a layer of a desired thickness and further accelerated to a fourth rotational speed to dry the coating layer.

In U.S. Pat. No. 5,453,406 (the '406 patent) issued to Chen, methods are disclosed for providing an aspect ratio independent spin on glass (SOG) coating by dispensing a first layer of the coating at a low speed followed by second layer of the coating dispensed at a high speed. This method requires that one additional step be added to the production process for each coating step in the prior art processes.

U.S. Pat. No. 5,567,660 issued to Chen et al. discloses a process similar to the '406 patent. A SOG is statically dispensed on the substrate and the substrate is spun at a first low speed followed by a second higher speed. A difficulty encountered in this method, as with other methods employing lower spin speeds, is that radial striations may occur in the coating layer. Radial striations are generally a result of either the dispense liquid not having sufficient momentum to be distributed evenly over a nonplanar surface or the liquid not preferentially wetting the substrate surface.

U.S. Pat. No. 5,066,616 issued to Gordon discloses methods for producing a layer of photoresist. The Gordon methods involve dispensing a liquid solvent underlayer to initially wet the surface of the wafer. A photoresist layer is then spun on top of the solvent layer as a means to better ensure more complete coverage of the wafer surface by the photoresist. The Gordon methods provide a solution of the problem of mottling; however, the methods require the additional dispensing of a solvent layer prior to the photoresist layer. The solvent layer may increase the possibility of defect formation following the evaporation of the solvent underlayer and nonuniform thinning of the photoresist by the solvent underlayer.

Thus, it is apparent that a need exists for an improved method for spin dispensing process liquids, such as photoresist, which overcomes, among others, the above-discussed problems to produce a more uniform layer of process liquid over the surface of the wafer.

BRIEF SUMMARY OF THE INVENTION

The above need and others are addressed by methods and apparatuses of the present invention that provide for increased uniformity in the distribution of process liquid over a surface, namely photoresist over a semiconductor wafer substrate surface. The methods include dispensing a process liquid on the surface and rotating the surface at a first speed to distribute an effective amount of the process liquid to substantially wet the surface. The method further includes rotating the surface at a second speed to distribute an effective amount of the process liquid to produce a layer of the process liquid having a desired thickness on the surface.

In a preferred embodiment for dispensing photoresist onto the surface of a semiconductor wafer, the method includes rotating the wafer at the first speed prior to dispensing the photoresist onto the surface. The preferred method further includes decelerating the wafer from the first to the second speed while dispensing the photoresist, and terminating the dispensing process after spinning at the second speed for a predetermined period of time.

The present invention is generally applicable to process liquids having both high and low viscosities, as well as liquids having varying affinities for the surface. The methods of the present invention are most applicable for distributing high viscosity and/or low affinity process liquids, such as photoresist, over a surface, such as a semiconductor substrate. Rotation of the surface at a high first speed provides for a substantially wetted surface by imparting sufficient momentum to flow the process liquid over nonplanar surface topography and to overcome surface tension effects between the liquid and the surface. The surface can then be decelerated to the second rotational speed that is selected to produce a desired final thickness of the process liquid layer.

Accordingly, the present invention provides methods for uniformly distributing process liquid on a rotating surface. The present invention may also provide for less process liquid and slower rotational speeds to ensure full coverage of the surface. These and other details, objects, and advantages of the invention will become apparent as the following detailed description of the present preferred embodiments thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF THE INVENTION

Figure 1:
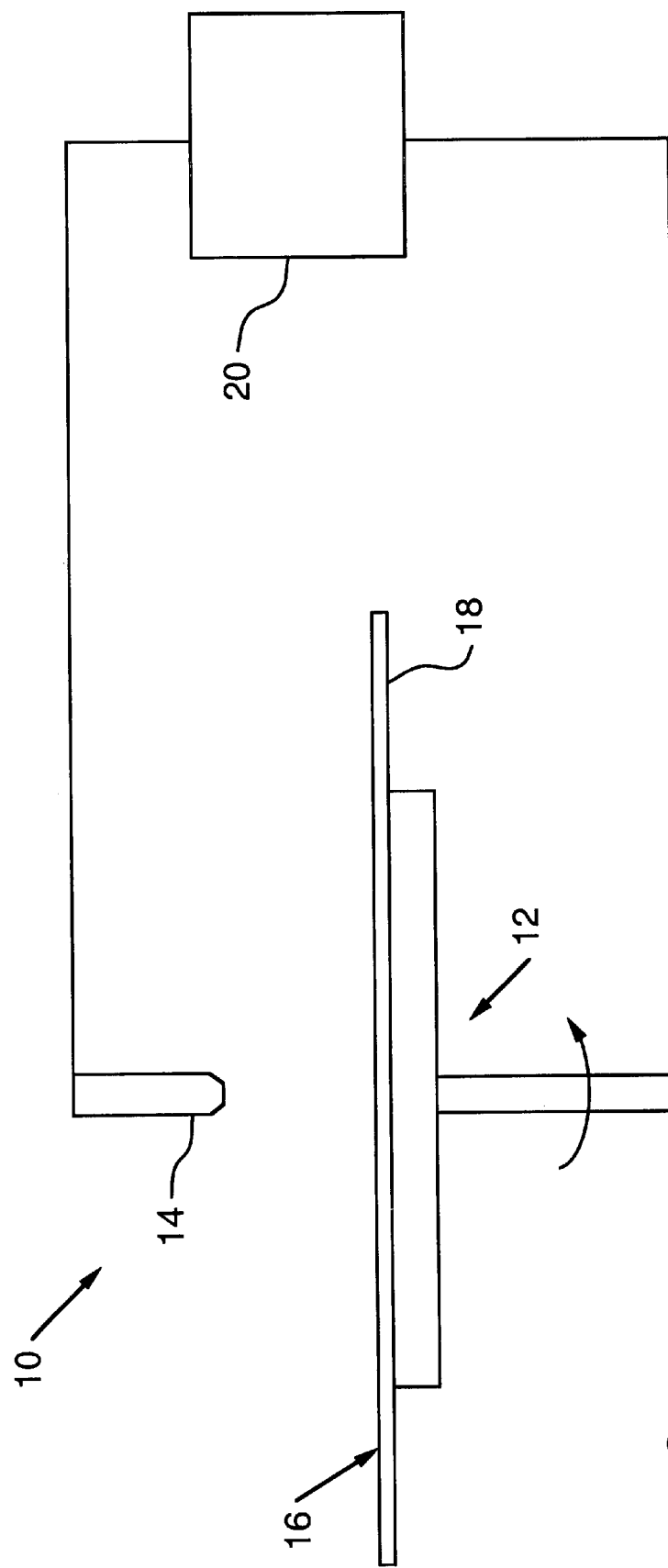
FIG. 1 is side view of a spin dispensing apparatus of the present invention; and, FIG. 2 is a time line of the processing steps in a preferred embodiment of the present invention.

Methods of the present invention will be described generally with reference to a spin dispensing, or coating, apparatus 10 shown in the FIG. 1 for the purpose of illustrating present preferred embodiments of the invention only and not for purposes of limiting the same. The apparatus 10 includes a rotatable spin chuck 12 and a dispense nozzle 14 directed toward the chuck 12. The nozzle 14 is used to dispense a process liquid, such as photoresist, onto a surface 16 of a substrate 18 positioned on the chuck 12. Preferably, the apparatus 10 includes a controller 20 connected to the dispense nozzle 14 and the chuck 12. The controller 20 is used to control the dispensing of the process liquid and the rotation of the chuck 12 in accordance with the methods of the present invention. The controller 20 can be incorporated into spin coating apparatuses known in the art, such as an SVG 8800 coater track or a TEL Mark 8, as well as other apparatuses that can be operated in accordance with the methods of the present invention.

The methods provide for a more evenly distributed layer of process liquid over a substrate by imparting to the process liquid sufficient momentum to overcome nonplanar topography on the surface and surface tension forces in the liquid with respect to the surface. The methods can generally be used to distribute any process liquid over the surface of the substrate. However, the methods are of greater utility when the process liquid has a high viscosity or does not preferentially wet the surface (i.e., the process liquid has a low affinity for the surface). In particular, the methods are useful for distributing photoresist over the surface of a semiconductor wafer. Photoresist compositions are generally high viscosity materials, such as polymethylmethacrylate (PMMA), novolac resins and polyimides, that have varying affinities for the different surface layers placed on a substrate during the production of an integrated circuit.

Figure 2:
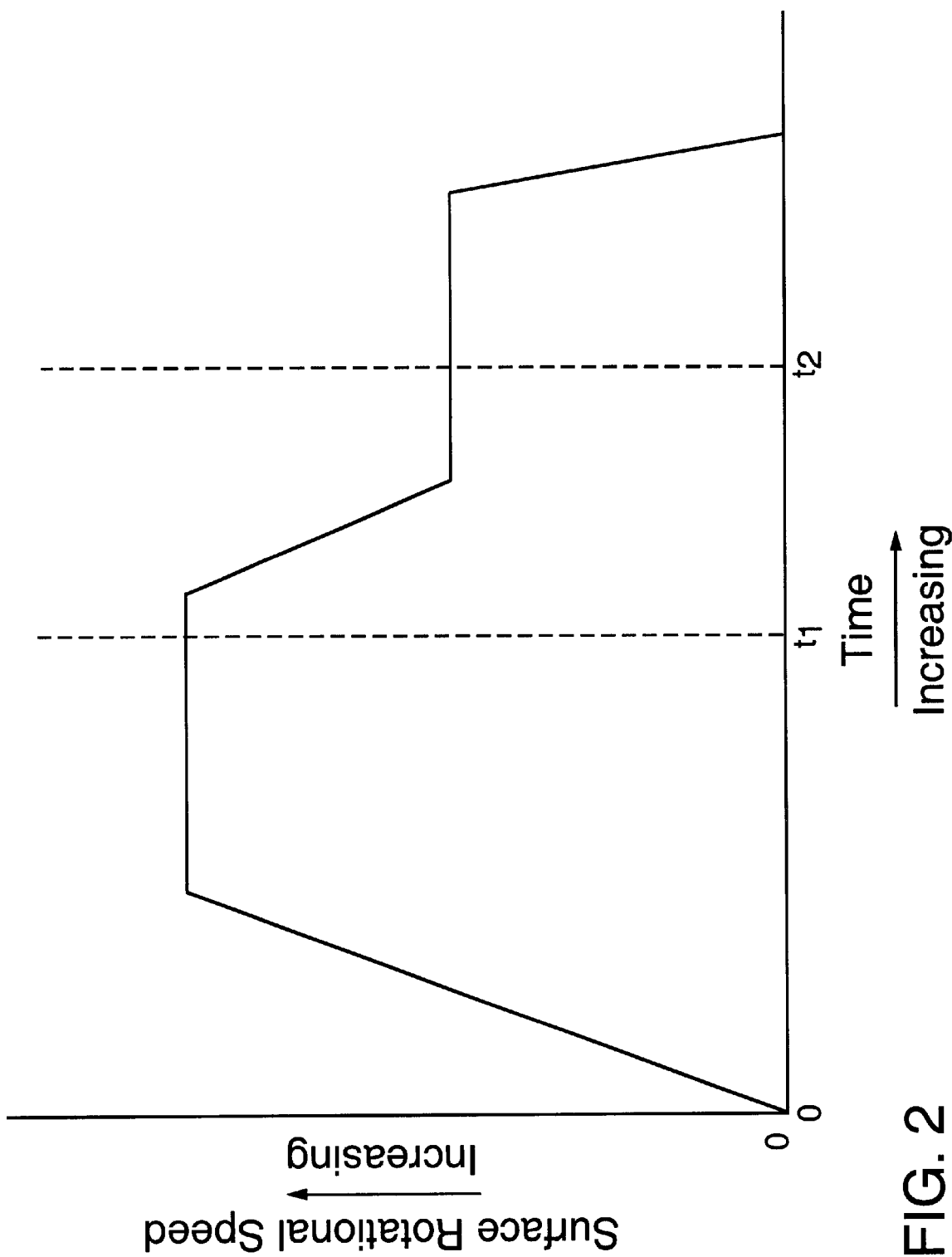

In a preferred embodiment of the method shown in FIG. 2, the substrate 18 is placed on the chuck 12 and the chuck 12 and substrate 18 are rotated at a first speed. The first speed is chosen to impart sufficient momentum to the process liquid dispensed onto the surface 16 of the substrate 18 that the process liquid will flow over nonplanar surface topography encountered and will overcome surface tension effects to substantially cover the entire surface 16. The selection of the first speed is not limited to a speed that will result in a layer of a given thickness, but only to those speeds that will substantially wet the surface 16. For example, a first speed of at least 4000 rpm would typically impart sufficient momentum to distribute an effective amount of photoresist material to substantially wet a semiconductor surface 16. An additional benefit of rotating the surface 16 at a high rate is that particulate matter that may be on the surface 16 as contaminants may be removed by the high velocity process liquid.

In a preferred embodiment, dynamic dispensing of process liquid to wet the surface is performed with the surface rotating at the first speed, shown schematically at time $t_1$ in FIG. 2. Dynamic dispensing at the first spin speed immediately imparts sufficient momentum to the process liquid to distribute the liquid over the surface, thereby avoiding problems that occur at low spin speeds. Static dispensing of the process liquid on the surface can be performed followed by rotational acceleration of the surface to the first speed. However, unless the surface is rapidly accelerated, striations and incomplete coverage of the wafer, similar to defects that occur at low spin speeds, may be encountered using the static dispense and acceleration methods.

Also in a preferred embodiment, the surface is decelerated to a second speed, when an effective amount of process liquid has been dispensed to substantially cover the entire surface. The process liquid is preferably dispensed during deceleration and terminated after the second speed is reached. The second speed is selected to distribute the process liquid over the surface to achieve a desired final thickness of the process liquid layer on the surface. Preferably, as shown by time $t_2$ in FIG. 2, dispensing of the process liquid is continued until after the second spin speed is reached. An effective amount of the process liquid is dispensed during that time to produce the desired thickness layer on the surface.

The sequencing of the process steps is performed to facilitate a uniformly distributed layer in a number of ways. Dispensing of the process liquid during the deceleration of the surface is performed 1) to distribute additional process liquid over the surface of the wafer necessary to produce a layer of the desired final thickness; and 2) to prevent the surface from drying during deceleration. In addition, dispensing the photoresist during deceleration can reduce the total spin time required to distribute the process liquid to the periphery without requiring an excess amount of process liquid.

Alternatively, the dispensing step can be terminated prior to or during the deceleration of the surface and reinitiated at the second speed. Depending upon the process liquid used, the wetting of the surface at the first spin speed may increase the affinity of the surface for the process liquid. In that case, the drying of the process liquid may not greatly affect or could potentially enhance the ability to uniformly distribute the process liquid at a later step. Also, the dispensing can be performed during deceleration, but terminated prior to achieving the second spin speed.

It is preferred that the spinning of the surface is continued at the second speed following the termination of the dispensing step. The additional spinning at the second speed serves to uniformly distribute the process liquid over the surface and/or to form a planar layer of the process liquid on the surface. When the distribution of the process liquid over the surface is complete, rotation of the surface is ceased.

In the alternative, additional steps can be performed following the spinning of the surface at the second speed. The surface can be further decelerated and rotated to dry the process liquid on the surface and to lessen the possibility that additional spinning will adversely affect the final layer thickness. The surface can also be accelerated to achieve a thinner layer by spinning additional process liquid off the surface or to accelerate the drying of the process liquid. The dispensing of process liquid may be restarted either at the second spin speed or at different speeds to provide additional layers of the process liquid. The dispense step can be continued at the second spin speed to effect a distribution pattern of the process liquid. The surface can also be subjected to additional spinning steps, either fast or slower, to vary the characteristics within the layer.

An example of a preferred embodiment of the method is provided with respect to producing a photoresist layer on a surface of a semiconductor substrate. The semiconductor wafer is placed on the spin chuck and rotated at a first speed of at approximately 5000 rpm. Photoresist compositions having a viscosity of approximately 20 centipoise or less have been found to be effectively distributed over the surface of an 8 inch semiconductor wafer at these speeds. Photoresist at a temperature of 21.5° C. is dispensed at 3 cm³/sec. from the dispense nozzle in a 23° C. spin coating environment for approximately 0.75 seconds, at which time an effective amount of photoresist had been dispensed to wet the surface.

The surface is immediately decelerated at approximately 5000 rpm/sec. for approximately 0.5 sec to a second spin speed of approximately 2500 rpm/sec. during which time dispensing of the photoresist continues. Dispensing of the photoresist is continued for an additional 0.75 sec. after the second speed is reached to dispense an effective amount of the photoresist to produce a layer having the desired final thickness. After dispensing is terminated, spinning of the substrate is continued to distribute the photoresist over the surface and form a planar layer of photoresist on the surface. The rotation of the substrate is ceased after the photoresist is distributed and the substrate is removed from the spin chuck.

Those of ordinary skill in the art will appreciate that the present invention provides significant advantages over the prior art. In particular, the subject invention provides a method to reduce the number of defects in coating layers by more uniformly distributing a process liquid over a surface. While the subject invention provides these and other advantages over prior art, it will be understood, however, that various changes in the details, materials and arrangements of steps which have been herein described and illustrated in order to explain the nature of the invention may be made by those skilled in the art within the principle and scope of the invention as expressed in the appended claims.

What is claimed is:

1. A method of producing a layer of a process liquid on a surface, comprising:

rotating said surface at a first speed;

decelerating said surface to a second speed, wherein said second speed is sufficient to produce a desired final thickness of said layer of process liquid on said surface; and dispensing said process liquid on said surface during said deceleration for an appreciable time and in an effective amount sufficient to produce a layer of desired final thickness on said surface.

2. The method of claim 1 wherein said surface is a semiconductor surface.

3. The method of claim 1 wherein said rotating includes rotating at a first speed sufficient to impart momentum to flow said process liquid over nonplanar topography on said surface.

4. The method of claim 1 wherein said rotating includes rotating at a first speed sufficient to impart momentum to said process liquid to overcome surface tension between said process liquid and said surface.

5. The method of claim 1 wherein said rotating includes rotating at a first speed sufficient to distribute an effective amount of said process liquid to substantially wet said surface.

6. The method of claim 1 wherein said first speed is at least 4000 rpm.

7. The method of claim 6 wherein said first speed is approximately 5000 rpm.

8. The method of claim 1 wherein said dispensing occurs for approximately 0.75 seconds at a rate of approximately 3 cm$^3$/sec.

9. The method of claim 1 wherein said decelerating occurs for approximately 0.5 seconds at a rate of approximately 2500 rpm/sec.

10. The method of claim 1 further comprising terminating said dispensing of said process liquid.

11. The method of claim 10 wherein said terminating dispensing occurs during said deceleration of said surface from said first speed to said second speed.

12. The method of claim 1 further comprising rotating said surface at a third speed.

13. The method of claim 1 further comprising ceasing rotation of said surface.

14. A method of producing a layer of a process liquid on a surface, comprising:

rotating said surface at a first speed;

decelerating said surface to a second speed, wherein said second speed is sufficient to produce a desired final thickness of said layer of process liquid on said surface;

dispensing said process liquid on said surface during said deceleration for an appreciable time and in an effective amount sufficient to produce a layer of desired final thickness on said surface; and terminating said dispensing of said process liquid.

15. The method of claim 14 wherein said surface is a semiconductor surface.

16. The method of claim 14 wherein said first speed is at least 4000 rpm.

17. The method of claim 14 further comprising rotating said surface at a third speed.

18. The method of claim 14 further comprising ceasing rotation of said surface.

19. A method of producing a layer of a process liquid on a surface, comprising:

dispensing said process liquid on said surface;

rotating said surface at a first speed to distribute an effective amount of said process liquid to substantially wet said surface;

decelerating said surface from said first speed to a second speed during said dispensing, said dispensing occurring during deceleration for an appreciable time and in an effective amount sufficient to produce a layer of desired thickness on said surface, said second speed selected to produce a layer of desired final thickness on said surface; and rotating said surface at said second speed to distribute an effective amount of said process liquid to produce a layer of said process liquid on said surface.

20. A method of producing a layer of a photoresist on a surface, comprising:

dispensing said photoresist on said surface;

rotating said surface at a first speed to distribute an effective amount of said photoresist to substantially wet said surface;

decelerating said surface to a second speed during said dispensing, said dispensing occurring during deceleration for an appreciable time and in an effective amount sufficient to produce a layer of desired final thickness on said surface, said second speed selected to produce a layer of desired final thickness on said surface.

21. A method of producing a layer of a photoresist on a surface, comprising:

dispensing said photoresist on said surface;

rotating said surface at a first speed; and decelerating said surface to a second speed during said dispensing, said dispensing occurring during deceleration for an appreciable time and in an effective amount sufficient to produce a layer of desired final thickness on said surface, said second speed selected to produce a layer of desired final thickness on said surface.

22. A method of producing a layer of a photoresist on a surface, comprising:

rotating said surface at a first speed;

dispensing said photoresist on said surface during said rotation; and decelerating said surface to a second speed during said dispensing, said dispensing occurring during deceleration for an appreciable time and in an effective amount sufficient to produce a layer of desired final thickness on said surface, said second speed selected to produce a layer of desired final thickness on said surface.

* * * * *